United States Patent
Dahms et al.

[11] Patent Number: 6,099,711
[45] Date of Patent: Aug. 8, 2000

[54] PROCESS FOR THE ELECTROLYTIC DEPOSITION OF METAL LAYERS

[75] Inventors: Wolfgang Dahms; Heinrich Meyer; Stefan Kretschmer, all of Berlin, Germany

[73] Assignee: Atotech Deutschland GmbH, Berlin, Germany

[21] Appl. No.: 09/066,313

[22] PCT Filed: Nov. 21, 1996

[86] PCT No.: PCT/EP96/05140

§ 371 Date: Apr. 23, 1998

§ 102(e) Date: Apr. 23, 1998

[87] PCT Pub. No.: WO97/19206

PCT Pub. Date: May 29, 1997

[30] Foreign Application Priority Data

Nov. 21, 1995 [DE] Germany .......................... 195 45 231

[51] Int. Cl.$^7$ .............................. C25D 5/18; C25D 21/18
[52] U.S. Cl. .................... 205/101; 205/103; 205/104; 205/292; 205/920
[58] Field of Search ................... 205/102, 103, 205/104, 101, 125, 292, 920

[56] References Cited

U.S. PATENT DOCUMENTS 5,186,811  2/1993  Otani et al. .............................. 205/125

FOREIGN PATENT DOCUMENTS

| 0 402 896 | 6/1990 | European Pat. Off. . |
|---|---|---|
| 27 39 427 | 12/1983 | Germany . |
| 261 613 | 11/1988 | Germany . |
| 33 07 748 | 8/1990 | Germany . |
| 215 589 | 6/1994 | Germany . |
| 43 44 387 | 6/1995 | Germany . |
| 1396436 | 6/1975 | United Kingdom . |
| PCT/GB89/00042 | 1/1989 | WIPO . |

OTHER PUBLICATIONS

Pulse Reverse Copper Plating for Printed Circuit Boards, William F. Hall et al, AES 10th Plating in the Electronics Industry Symposium, Feb. 1983.

Pulse Plating of Copper for Printed Circuit Board Technology, by M.R. Kalantary & D.R. Gabe, Loughborough University of Technology, Leicestershire, England, Apr. 1991.

Pulse–Plating–Elektroytische MEtallabscheidung mit Pulsstrom, Ed. Jean–Claude Puippe and Frank Leaman, Eugene G. Leuze Verlag Saulgau, Germany, 1986, Month of Publication Not Available p. 26.

Hartverchromung mittels eines Gleichrichters mit pulsierenden Wellen und periodischer Umkehr der Polaritat by C. Colombini in the Professional Paper Galvanotecknik, 1988, Month of Publication Not Available pp. 2869 to 2871.

George W. Jernstedt, Better Deposits at Greater Speeds by P R Plating, *Plating*, Jul. 1948.

Primary Examiner—Kathryn Gorgos
Assistant Examiner—William T. Leader
Attorney, Agent, or Firm—Paul & Paul

[57] ABSTRACT

The invention relates to a method for the electrolytic deposition of metal coatings, in particular of copper coatings with certain physical-mechanical and optical properties and uniform coating thickness. According to known methods using soluble anodes and applying direct current, only uneven metal distribution can be attained on complex shaped workpieces. By using a pulse current or pulse voltage method, the problem of the coatings being of varying thickness at various places on the workpiece surfaces can indeed be reduced. However, the further problem of the geometric ratios being changed continuously during the depositing process by dissolving of the anodes is not resolved thus. This can be avoided by using insoluble anodes. In order to guarantee sufficient stability of the anodes and a bright coating even at those points on the workpiece surfaces, onto which the metal is deposited with high current density, it is essential to add compounds of an electrochemically reversible redox system to the depositing solution.

10 Claims, 4 Drawing Sheets

PROCESS FOR THE ELECTROLYTIC DEPOSITION OF METAL LAYERS

The invention relates to a method for the electrolytic deposition of metal coatings with uniform coating thickness, particularly of copper coatings with certain physical-mechanical and optical characteristics.

BACKGROUND OF THE INVENTION

In order to achieve certain physical-mechanical properties in metal coatings, which can be deposited electrolytically, certain additive compounds must be added in small amounts to the deposition solution. Of main concern in this respect are organic materials, which have an effect on the bright finish, the levelling and the uniformity of the deposition on large surfaces, avoidance of so-called burnt-on particles, i.e. deposition of granular crystalline coatings and also the construction of metal coatings with high fracture elongation and tensile strength.

The disadvantage in this respect is that these materials generally disintegrate during deposition, so that they have to be replenished during the operation. Admittedly, the observation of constant conditions in production is mostly very difficult, since the materials themselves are only present in very small concentrations in the deposition solutions, and in addition a complicated mixture of several materials of this type is also most often required to achieve certain coating properties and finally during dissolution degraded products are formed also, which have an effect on the metal coating properties. Therefore, an analytical survey of the additive compounds is not only very difficult, but is generally not adequate either for completely describing the state of the deposition bath, with the result that analytical methods for controlling the bath may only be used in a qualified manner.

In addition there is a demand, in the coating of complex shaped workpieces for example of circuit boards with very fine borings, for achieving as uniform a thickness of metal coating as possible on all points of the workpiece. It is possible, with appropriate deposition baths with optimised composition, to enlarge the metal coating thickness even in places with a low current density. However, the named additive compounds only influence the metal dispersion so slightly that the problem was not solved by these optimising measures.

In particular, it was not possible with the named measures to achieve even an adequately uniform distribution of metal coating thickness in complex shaped workpieces, for example in circuit boards with very fine borings.

Various means of solving the problem have been suggested therefore in the literature, however none of them have yet led to entirely satisfactory solutions.

As a solution for the equalising of the metal distribution on the surfaces of the workpieces which are to be coated, the use of insoluble anodes during metal deposition is suggested. Anodes of this type are known from the German Patent document DD 215 589 B5 and in the publication DD 261 613 A1. Furthermore methods of this type are also described in DE 43 44 387 A1. In these publications mention is made also of the addition of compounds of electrochemically reversible redox systems to the depositing solution, with which systems the addition of metal salts for completing the deposited metal ions should be avoided.

A periodic current reversal during electrolysis is suggested as a further solution for equalising the coating thickness on the workpieces ("Pulse Plating-Elektrolytische Metallabscheidung mit Pulsstrom", Ed. Jean-Claude Puippe and Frank Leaman, Eugen G. Leuze Verlag, Saulgau, Germany, 1986, p.26 and "Pulse Plating of Copper for Printed Circuit Technology" M. R. Kalantary, D. R. Gabe, Metal finishing 1991 pp. 21 to 27). However, adequate uniformity of the deposited metal coatings cannot be achieved in this way on large and in addition complex shaped workpieces.

Furthermore, in DE 27 39 427 C2 a method for uniform coating of profiled workpieces, which have narrow recesses, is described. For this purpose, the recesses in the surface of the workpiece are treated very intensively with electrolytic solution and, at the same time, an electric cycle of pulses lasting from 1 $\mu$sec to 50 $\mu$sec with considerably larger breaks in between was applied to the workpiece. This procedure is very costly however, since a targeted injection at the profiles in workpiece surfaces is not possible at least for mass production or it requires a very high industrial fitting cost.

In WO-89/07162 A1 an electrochemical method for depositing metals is described, preferably for copper from a sulphuric acid copper electrolyte with organic additive compounds for improving the physical-mechanical properties of workpieces, for example circuit boards. For this purpose, alternating current with varying long cathodic and anodic pulses is used. Coatings are successfully deposited on complex shaped workpieces, such as for example circuit boards, with more uniform coating thickness. Further indications for overcoming the problem of avoiding varying coating thicknesses by altering the geometric ratios in the electrolytic cell, for example by dissolving the anodes, are not offered.

When the experiments described there were repeated, an improvement in the metal dispersion in the fine borings of circuit boards could only be achieved, in our own findings, if at the same time, the optical appearance of the copper coating, deposited according to the method described in the publication, became worse. Furthermore, the ductility of these coatings was so slight that, even when a coated circuit board with borings was immersed just once for ten seconds into a 288° C. hot soldering bath, fractures in the copper coating, particularly at the transition from the circuit board surface to the boring wall, could be seen.

In the essay "Hartverchromung mittels eines Gleichrichters mit pulsierenden Wellen und periodischer Umkehr der Polarität" by C. Colombini in the Professional Paper Galvanotechnik, 1988, pp. 2869 to 2871 a method is likewise described, in which the metal coatings are deposited not by direct current but rather by pulsating alternating current. According to the author's proposal this serves for producing chrome coatings, which are more corrosion proof than traditional coatings. Admittedly, it states in this publication that chrome coatings, formed according to this method, are grey and do not shine, with the result that they must be polished subsequently to produce a glossy surface. Apart from the fact that a subsequent mechanical treatment of this type is very exacting and therefore very expensive, in many cases this cannot be carried out at all, for example when the surface spots, which are to be treated, are not accessible.

In the essay "Pulse Reverse Copper Plating for Printed Circuit Boards" by W. F. Hall et al., Proc. of the American Electrochemical Society, 10$^{th}$ Plating in the Electronic Industry Symposium, San Francisco, Calif., February 1983 it has been shown, furthermore, that copper coatings, which have been deposited by means of a pulsing current method, can be formed on circuit boards with a more uniform coating thickness from depositing solutions with brighteners, as with copper coatings which are deposited by direct current.

The copper coatings are matt, according to information in the publication, partly even brown or orange and do not consist thus of pure copper. To this extent it is surprising that, according to the author's data, high ductility values, namely high fracture elongation values, and tensile strength values, can be achieved using the method indicated. However, no adequately precise data about the deposition conditions, as, for example, the bath composition, temperature of the bath or the anodes used are given.

In EP 0 356 516 A1 a device for depositing electroplated coatings is shown, with which the physical-mechanical properties of the coatings can be improved, in the view of the inventor. For this purpose, the amplitude, shape and frequency of the currents flowing through the electrolytic bath during deposition are automatically changed. It is also stated that, by measuring and stabilising the current in the electroplating bath during deposition of the electroplated coatings, the physical-mechanical properties are likewise improved.

In EP 0 129 338 B1 a method for electrolytic treatment of the surface of a metal rail using graphite electrodes is described, in which, by using alternating current with asymmetrical positive and negative half-waves during the electrolytic treatment, the dissolution of the graphite electrodes used as anodes can be avoided, with the result that the distribution of current in the graphite electrode no longer alters and constant conditions can be maintained during electrolysis. Admittedly, no indications are given in this publication of how an improvement can be achieved in the physical-mechanical properties of deposited metal coatings and, at the same time, how to make the distribution of coating thickness as uniform as possible over a long period of operation.

THE PRESENT INVENTION

In order to produce circuit boards simply and economically, it is necessary to deposit copper coatings with very good mechanical-physical properties, in particular with a high fracture elongation and uniform brightness even in the high current density region. Since increasingly fine borings are contained in the circuit boards and, because of the increasing integration of components on the circuit boards, even greater demands are put on the uniformity of the coating thickness on the surface of the circuit boards, electrolytic deposition procedures for copper must be found, where the demands mentioned can be met. With the known methods, however, particularly after a long operational time a deposition of high-quality and uniformly thick metal layers, even on large surface substrates, which may also be complex in shape, is no longer reliably possible with a depositing bath without costly cleaning procedures or even with a new make-up. In particular, it is not possible to attain the demands mentioned (with the known methods) even while using higher current densities. Since, as is normal in this case, granular crystalline metal deposits are obtained (burnt-on particles), the physical-mechanical as well as the optical properties of coatings produced in this way are unsatisfactory, with the result that for that reason also there is need for an improvement in the known methods.

Hence the problem underlying the present invention is to avoid the disadvantages of the methods according to the state of the art and to find a simple and economic method for the electrolytic deposition of metal coatings, especially made of copper, the metal coatings, which are deposited according to the method, having very good physical-mechanical and optical properties, for example brightness, even in the places on the workpiece surfaces on which the metal is deposited with high current density, and having high fracture elongation even after a fairly long operational period in a depositing bath and having metal coating thickness which is almost the same in all places on the surface of the treated item, including within fine borings. In addition, the physical-mechanical properties of the coatings should accord with the highest demands even when using high current densities, for example of at least 6 $A/dm^2$ on the surface to be coated (amongst other things with regard to fracture elongation and tensile strength).

The problem is resolved by Patent claims 1 and 11. Preferred embodiments of the invention are given in the Sub-claims.

SUMMARY OF INVENTION

The invention is a method for electrolytic deposition of fine crystalline metal coatings, by means of a pulse current or pulse voltage method on complex shaped workpieces as cathodes, by using inert insoluble anodes coated with noble metals or oxides of noble metals and forming a deposition solution that contains ions of the metals to be deposited and certain compounds.

It has been shown that it is possible to improve the distribution of the coating thickness in deposited metal coatings, particularly in copper coatings, on the surface of complex shaped workpieces and in the borings in the workpieces by means of a pulse current or pulse voltage procedure without thus impairing the physical-mechanical properties of the deposited metal coatings, in particular the uniform brightness and high fracture elongation. When dimensionally stable, insoluble anodes are used for the anodes, the metal distribution on the outsides of the workpiece can also be maintained considerably more uniformly. If the depositing solution finally contains, besides the ions of the deposited metal and the additive compounds for controlling the physical-mechanical properties, also compounds of an electrochemically reversible redox system, by means of whose oxidised form moreover the ions of the deposited metal can be formed by dissolving corresponding metal parts, then flawless coatings can also be obtained optically and in the physical-mechanical properties by using higher current densities (for example over 6 $A/dm^2$).

In particular, copper coatings with a uniform high brightness can be deposited on circuit boards with fine borings, said copper coatings also having the capacity to withstand repeated thermal shock treatment in a soldering bath (immerssion for 10 seconds in a 288° C. hot bath and cooling subsequently at room temperature respectively), without fractures forming in the copper coating. In this respect the degree of metal coating distribution in the borings and on the surface of the circuit boards which can be achieved is very good. For that reason it is possible to deposit smaller amounts of metal on the circuit boards than with known methods, since the required layer thicknesses in the borings can be achieved more quickly.

In known procedures where insoluble anodes are used and direct current is applied it has been observed that the physical-mechanical properties of the deposited metal coatings as well as the distribution of the metal coating on the workpiece become worse when the depositing bath is operated over a fairly long period of time and has hence become old. This disadvantageous effect is likewise not established when using the claimed method.

BRIEF DESCRIPTIONS OF DRAWING FIGURES

DETAILED DESCRIPTIONS OF THE PREFERRED EMBODIMENTS

By means of the measures according to the invention it is possible for organic additive compounds to be used in the depositing solutions in order to produce metal coatings with the predetermined properties without the latter being degraded to a significant extent. The use of specific mixtures of additive compounds is not necessary. Furthermore, a high cathodic current density is attained. By means of this, an economic method is made possible, since the workpieces, which are to be treated, must remain in the unit for only a relatively short time in order to be coated with a metal coating of the predetermined thickness. A long life-span of the dimensionally stable, insoluble anodes can be attained, since only extremely small amounts of aggressive reaction products arise on the anodes.

In the pulse current method, the current is set galvanostatically between the workpieces, which are polarised as cathodes, and the anodes and modulated temporally by appropriate means. In the pulse voltage method a voltage is set potentiostatically between the workpieces and the anodes and the voltage is modulated temporally, so that a time-varying current is set.

By means of the pulse current or pulse voltage method, varying voltages are applied to the workpiece or varying currents are set between the workpiece and the dimensionally stable, insoluble alternative electrodes. For example, a cycle of pulse currents with anodic and cathodic current pulses is repeated periodically on the workpieces and if necessary with resting periods in between with the current strength zero. With corresponding adjustment of a current pulse cycle, the current pulse series mentioned is then set.

In a preferred embodiment, the current of the anodic current pulses is set to at least the same value as the current of the cathodic current pulses in the workpieces, preferably to a value which is two to three times as high as the value of the cathodic current pulses.

The duration of an anodic current pulse in the workpieces is set for example between 0.1 milliseconds (msec) and 1 second. The anodic pulse lengths are preferably of 0.3 to 10 milliseconds. In all, the quantity of charge for depositing the metal must be greater than that leading to the anodic redissolution of the metal from the workpiece.

Figure 1:
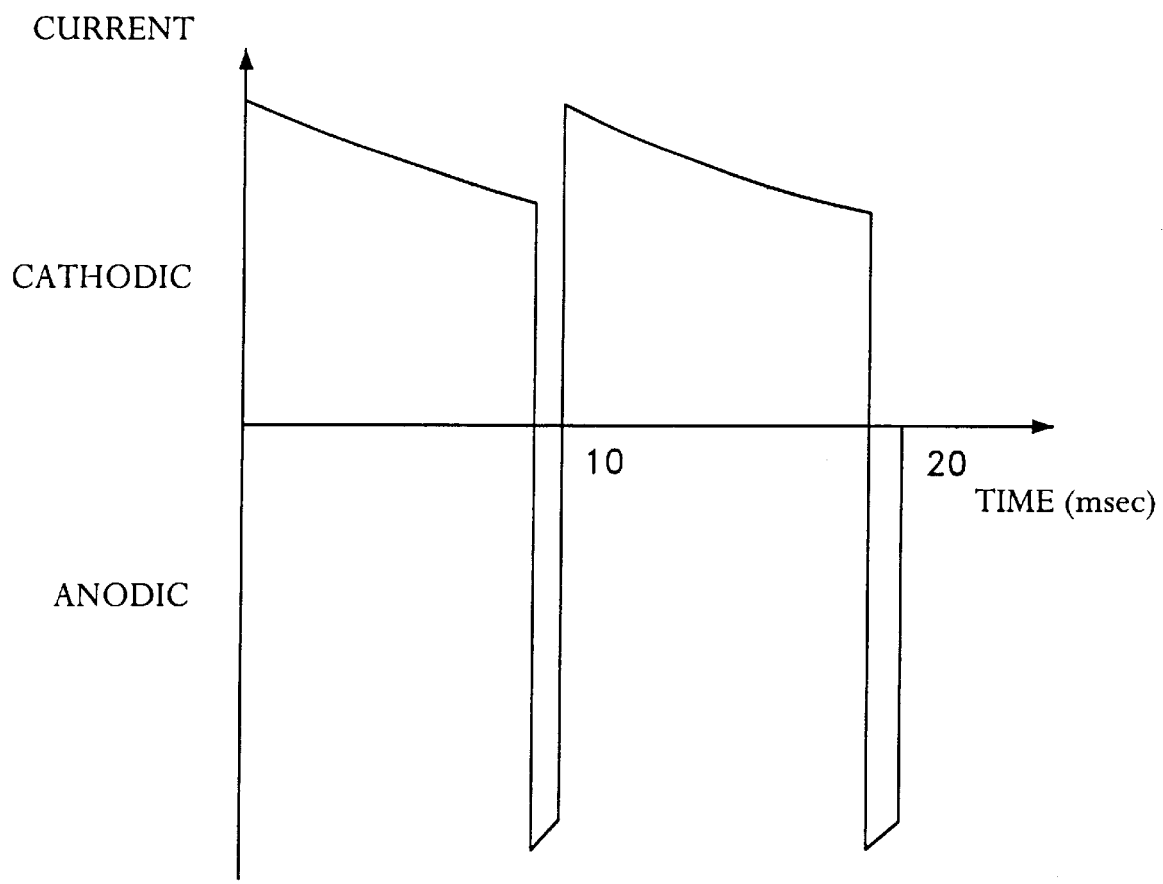
FIG. 1 is a diagrammatic illustration of a typical pulse cycle.
Figure 2:
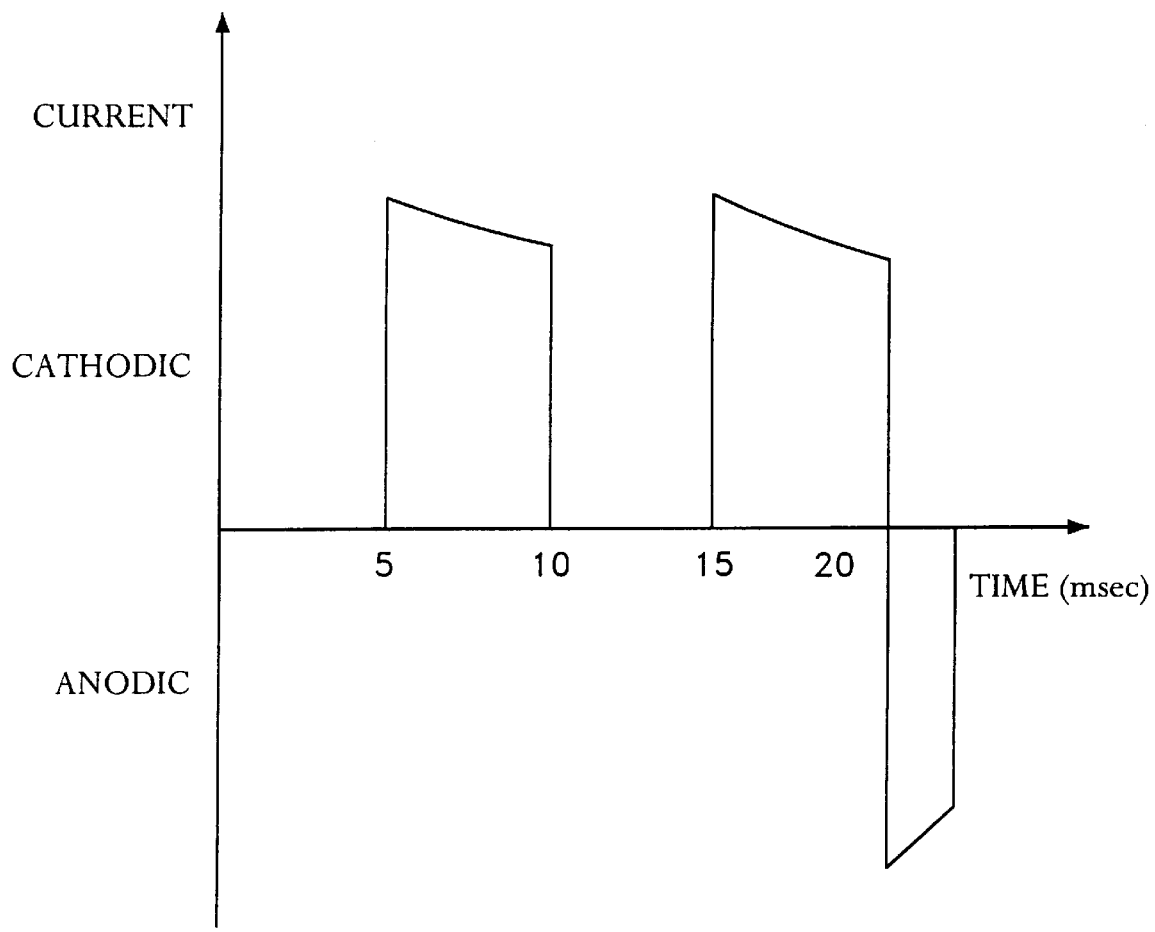
FIG. 2 is a diagrammatic illustration of another typical pulse cycle.

Typical pulse cycles are represented in FIGS. 1 and 2. In FIG. 1 firstly, a cathodic current pulse with a duration of 9.5 milliseconds is applied to the workpiece. This is followed immediately by an anodic current pulse, which has a peak value of roughly twice to three times as much. This double pulse is repeated periodically with a frequency of 100 Hertz.

In FIG. 2 a pulse cycle is shown, which gives improved results. The first cathodic phase follows a 5 millisecond rest phase, in which the current is zero. The subsequent cathodic current pulse lasts for 5 milliseconds. After that, there follows yet another 5 millisecond rest and subsequently once again a 5 millisecond cathodic current pulse. Only after that follows a 1 millisecond long anodic current pulse, the peak level of which is only a little higher than that of the cathodic current pulses.

Figure 3:
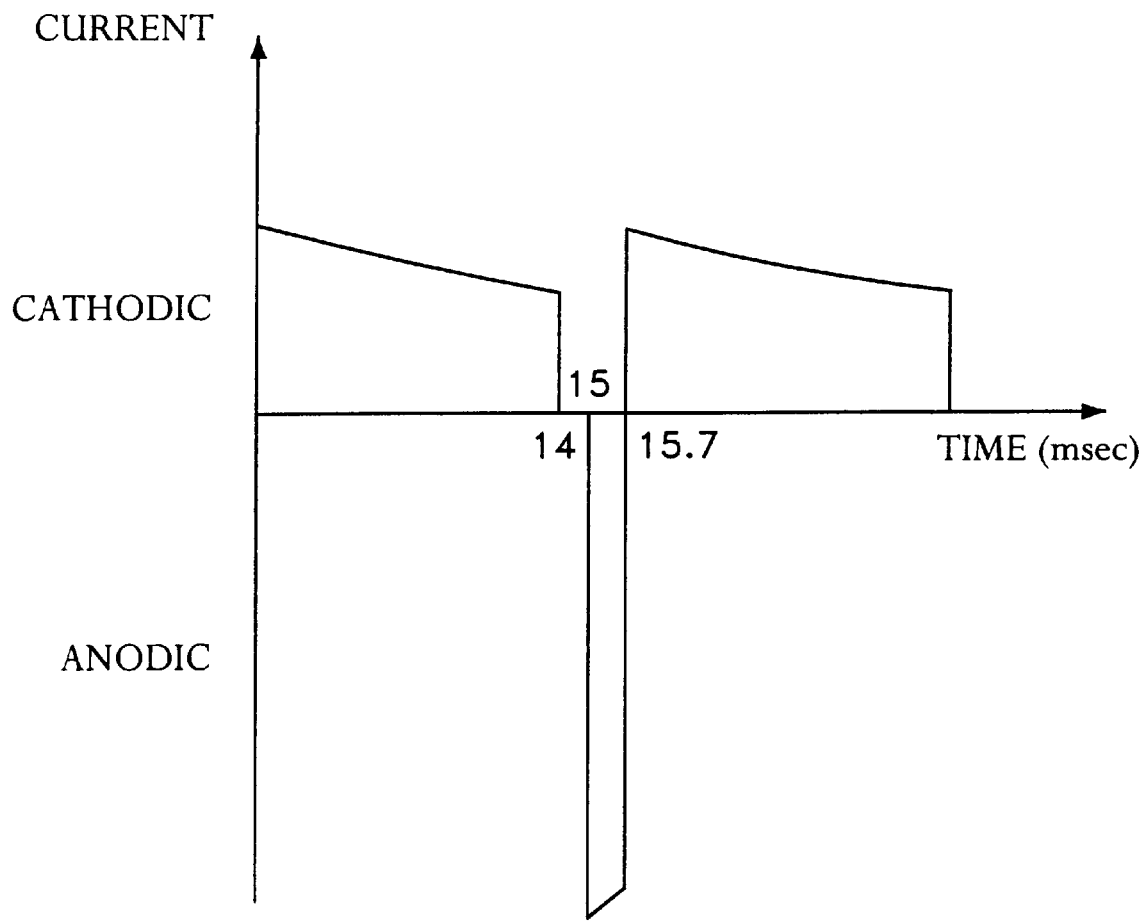
FIG. 3 is a diagrammatic illustration of a preferred current/voltage pulse cycle.

A preferred current/voltage pulse cycle is given in FIG. 3. In this cycle a further substantial improvement in the metal distribution is achieved. The distribution of coating thickness, particularly between narrow recesses, for example in thin borings in circuit boards and the remaining surface regions is markedly improved in this way. The following typical values are set for the individual current/voltage phases:

1. Cathodic pulse: approx. 14 msec, approx. 6 $A/dm^2$
2. Rest phase: approx. 1 msec, ≈0 $A/dm^2$
3. Anodic pulse: approx. 0.7 msec, approx. 15 $A/dm^2$ With suitable equipment for producing the described pulse cycles, several cathodic and/or anodic current pulses with varying peaks of current can also be set.

In a particular embodiment form, either an anodic current pulse or a resting period with current strength zero is set between two cathodic current pulses in the workpieces alternatingly.

No soluble anodes from the metal to be deposited are used as anodes, instead dimensionally stable, insoluble anodes are used. By using dimensionally stable, insoluble anodes a constant spacing can be set over time between the anodes and the workpieces. The anodes can be accommodated without problem in their geometrical shape to the electroplated item and, in contrast to soluble anodes, hardly change their geometric dimensions. Hence the spacing affecting the distribution of coating thickness on the surface of the electroplated item remains constant between the anode and the cathode.

In order to produce insoluble anodes, materials inert with respect to the electrolyte are used during electrolytic deposition such as, for example, stainless steel and lead. Preferably, anodes are used however, which contain titanium or tantalum as the basis material which is preferably coated with noble metals or oxides of the noble metals. As a coating, platinum, iridium or ruthenium, for example are used and also the oxides or mixed oxides of these metals. Besides platinum, iridium and ruthenium, also rhodium, palladium, osmium, silver and gold or their oxides and mixed oxides may, in principle be used for coating. An especially high resistance capacity relative to the electrolytic conditions could be observed for example in a titanium anode with an iridium oxide surface which was bombarded with fine particles, for example sphere-shaped bodies, and hence coated non-porously.

The amount of aggressive reaction products which arise on the anode is affected by the anodic current density. It was established that their rate of formation is very small beneath an anodic current density of 2 $A/dm^2$. Hence, the electrochemical effective anode surface selected must be as large as possible. In order to achieve effective anode surfaces, which are as large as possible, nevertheless within small spatial limitations, perforated anodes, anode meshes or expanded metal with an appropriate coating are used. In this way it is guaranteed as well that the anode surfaces can be heavily exposed to an intensive through-flow of the perforated anode materials. In the first place, the diffusion coating thickness on the anode is thus reduced, so that only a slight overvoltage arises on the anode, and on the other hand, any reaction products present are quickly removed from the anode surface. Meshes and expanded metal may also be used in several layers, so that the anode surface is increased even more and the anodic current density can thus be reduced even further. The anodic surfaces should furthermore be free of pores, which extend down to the underlying material.

Since the metal ions, which were spent in the deposition from the depositing solution, cannot be directly supplied subsequently by means of dissolution by the anodes, said metal ions are replenished by chemical dissolution of corresponding metal parts. For this purpose, compounds of an electrochemically reversible redox system are added to the deposition solution, the oxidised form of said system forming the metal ions in a redox reaction from the metal parts.

In order to replenish the metal ions, which are spent by deposition, a metal ion generator is thus used, in which parts of the metal to be deposited are contained. In order to regenerate the depositing solution, which has been depleted by consumption of metal ions, said depositing solution is led past the anodes, causing the oxidising compounds of the redox system to be formed from the reduced form. Subsequently, the solution is led through the metal ion generator, causing the oxidising compounds to react with the metal parts while constructing metal ions. Simultaneously, the oxidising compounds of the redox system are converted into the reduced form. Because of the formation of metal ions, the entire concentration of the metal ions, which are contained in the depositing solution, is kept constant. From the metal ion generator, the depositing solution goes back again in to the electrolytic chamber, which is in contact with the cathodes and anodes.

Iron(II) and iron(III) compounds are used as an electrochemically reversible redox system. Equally appropriate are the redox systems of the following elements: titanium, cerium, vanadium, manganese and chrome. They can be added to the copper depositing solution for example in the form of titanyl-sulphuric acid, cerium(IV)sulphate, sodium metavanadate, manganese(II)sulphate or sodium chromate. Combined systems can be advantageous for special applications.

After a short while the active $Fe^{2+}/Fe^{3+}$ redox system is formed from the iron(II)sulphate-heptahydrate which is added to the depositing solution. Said system is exceedingly suitable for aqueous, acidic copper baths. Other water-soluble iron salts, in particular iron(II)sulphate-nonahydrate can also be used, as long as they do not contain any biologically non-degradable (hard) complexing agents which can present problems in the waste water disposal (for example ferric ammonium alum). The use of iron compounds with anions, which lead to undesired secondary reactions in the copper depositing solution, such as for example chloride or nitrate, must likewise not be used.

The concentrations of compounds in the redox system must be arranged in such a way that, by dissolving the metal parts, a constant concentration of metal ions can be maintained in the depositing solution. Preferably, a concentration of at least 10 g of iron ions/liter of depositing solution is set. It is guaranteed thus, that the insoluble anodes, which are coated with noble metals or oxides of the noble metals, are not damaged. Furthermore, the problem is also avoided in which the noble metals or its oxides, which are eroded by the inert carrier materials of the anode, are not deposited on the copper pieces which are situated if necessary in a suitable separate container and which are dissolved by the effects of the iron(III) ions, in order to keep the copper ions concentration constant in the depositing solution. Moreover, the formation of granular crystalline metal coatings is hence also avoided in the high current density region (burnt-on particles).

The basic composition of a copper bath can vary within relatively wide limits when using the method according to the invention. In general, an aqueous solution of the following composition is used (all values in g/liter depositing solution):

| | |
|---|---|
| copper sulphate ($CuSO_4 \cdot 5H_2O$) | 20–250 |
| preferably | 80–140 or 180–220 |
| sulphuric acid, conc. | 50–350 |
| preferably | 180–280 or 50–90 |
| iron(II)sulphate($FeSO_4 \cdot 7 H_2O$) | 1–120 |
| preferably | 20–80 |
| chloride ions (added for example as NaCl) | 0.01–0.18 |
| preferably | 0.03–0.10. |

In place of copper sulphate other copper salts may be used at least in part. The sulphuric acid can also be replaced in part or completely by fluoroboric acid, methane sulphonic acid or other acids. The chloride ions are added as alkali chloride, for example sodium chloride, or in the form of hydrochloric acid, analytically pure. The addition of sodium chloride may be omitted completely or in part, if halogenide ions are already contained in the additives.

Besides copper, other metals such as, for example, nickel or its alloys can also be deposited in principle using the method according to the invention.

In addition, conventional brighteners, levelers, wetting agents and other additives may be added to the depositing solution. In order to obtain bright copper deposits with predetermined physical/mechanical properties, at least one water-soluble sulphur compound and an oxygen-containing, highly-molecular compound are added. Additive compounds such as nitrogenous sulphur compounds, polymeric nitrogen compounds and/or polymeric phenazonium compounds may also be used.

The additive compounds are contained in the depositing solution within the following concentration ranges (all values again in g/liter of depositing solution).

| | |
|---|---|
| Conventional oxygen-containing, high-molecular compounds | 0.005–20 |
| preferably | 0.01–5 |
| conventional water-soluble organic sulphur compounds | 0.0005–0.4 |
| preferably | 0.001–0.15 |

Some oxygen-containing, high-molecular compounds are listed in Table1.

Table 1
Oxygen-Containing, High-Molecular Compounds
carboxymethylcellulose
nonylphenolpolyglycol ether
octandiolbis-(polyalkylene glycolether)
octanolpolyalkylene glycolether
oleic acidpolyglycol ester
polyethylenepropylene glycol
polyethylene glycol
polyethylene glycoldimethylether
polyoxypropylene glycol
polypropylene glycol
polyvinylalcohol
stearic acidpolyglycol ester
stearyl alcoholpolyglycol ether
β-naphtholpolyglycol ether In Table 2, there are various sulphur compounds with appropriate functional groups for producing water-solubility.

Table 2
Sulphur Compounds
3-(benzthiazolyl-2-thio)-propylsulphonic acid, sodium salt
3-mercaptopropane-1-sulphonic acid, sodium salt
ethylendithiodipropylsulphonic acid, sodium salt
bis-(p-sulfophenyl)-disulphide, disodium salt
bis-($\omega$-sulfobutyl)-disulphide, disodium salt
bis-($\omega$-sulfohydroxypropyl)-disulphide, disodium salt
bis-($\omega$-sulfopropyl)-disulphide, disodium salt
bis-($\omega$-sulfopropyl)-sulphide, disodium salt
methyl-($\omega$-sulfopropyl)-disulphide, disodium salt
methyl-($\omega$-sulfopropyl)-trisulphide, disodium salt
O-ethyl-dithiocarbonic acid-S-($\omega$-sulfopropyl)-ester, potassium salt thioglycolic acid
thiophosphoric acid-O-ethyl-bis-($\omega$-sulfopropyl)-ester, disodium salt
thiophosphoric acid-tris-($\omega$-sulfopropyl)-ester, trisodium salt.

Thiourea derivatives and/or polymer phenazonium compounds and/or polymer nitrogen compounds are used as additive compounds in the following concentrations (all values in g/liter of depositing solutions):

|  |  |
|---|---|
|  | 0.0001–0.50 |
| preferably | 0.0005–0.04 |

In order to make-up the depositing solution, the additive compounds are added to the basic composition which is presented here. The conditions of the copper deposition are given in the following:

| pH value: | <1 |
|---|---|
| temperature: | 15° C.–50° C. |
| preferably | 25° C.–40° C. |
| cathodic current density: | 0.5–12 A/dm$^2$ |
| preferably | 3–7 A/dm$^2$ |

By injecting air into the electrolytic chamber, the depositing solution is stirred. By additional injection of the anodes and/or of the cathode with air, the convection is increased in the region of the respective surfaces. Hence, the transport of materials in the vicinity of the cathode or the anode is optimised, with the result that greater current densities can be achieved. If applicable, aggressive oxidation means, occurring in small amounts, such as for example, oxygen and chlorine, are thus removed from the anodes. Moving the anodes and cathodes also improves the transport of materials to the respective surfaces. In this way, deposition which is constant and which has controlled diffusion is achieved. The movements can be achieved horizontally, vertically, in uniformly lateral movement and/or by means of vibration. A combination with injection of air is especially effective.

In an arrangement with a metal depositing solution, which is suitable for carrying out the method according to the invention, there is/are a. at least one first container for receiving a metal depositing solution, b. furthermore, metallic workpieces to be coated electrolytically with metal and which are brought into contact with the depositing solution, c. in addition, electrodes, which are arranged at a spacing relative to the workpieces and which can be brought into contact with the depositing solution as anodes, made from a material which does not dissolve by means of anodic reaction during metal deposition, d. in addition, a voltage or current supply unit which is connectable electrically with the electrodes and the workpieces and which is designed in such a way that the electrodes and the workpieces can be provided with alternating voltage or current, e. in addition at least one second container (copper ion generator) for receiving pieces of the metal which is deposited on the workpieces, the second container being connected to the first container for transporting fluid in such a way that the depositing solution from the first container can be conveyed into the second and from there back to the first, f. finally devices for conveying the depositing solution, for example pumps, from the first container to the second and from there back to the first.

The metal depositing solution is then contained in the first container and contains ions of the metal, which is to be deposited on the workpieces, and compounds of an electrochemically reversible redox system.

In the first embodiment (immersion method) the workpieces are alternatively arranged in the first container. In a second embodiment, the workpieces and the anodes can also be arranged outwith the container. In this situation, there are devices provided for conveying the depositing solution from the first container to the workpieces, for example pumps, in order to bring the workpieces and the anodes into continual contact with the depositing solution. This arrangement is used in a horizontal conveyorized unit, as it can be used for treating circuit boards.

Normally coating units are used, in which the circuit boards are sunk in a vertical position into a container, containing the depositing solution and are situated in this position opposite the dimensionally stable insoluble anodes which are arranged on both sides. The anodes can be separated by diaphragms from the catholytic chamber, in which the circuit boards are situated. Appropriate as diaphragms are for example woven polypropylene or membranes with a metal ion and anion permeability, such as for example Nafion membranes (from the company Du Pont de Nemours Inc., Wilmington, Del., U.S.A.). In this arrangement, the depositing solution is pumped firstly to the circuit boards, which are polarised as cathodes, and lead from there to the anodes. The cathode and anode surfaces are injected by spray nozzles assemblies. This unit comprises besides the electrolytic cell with the container, the copper ion generator, into which the depositing solution, coming from the anodes, proceeds. There the depositing solution is enriched again with copper ions.

Figure 4:
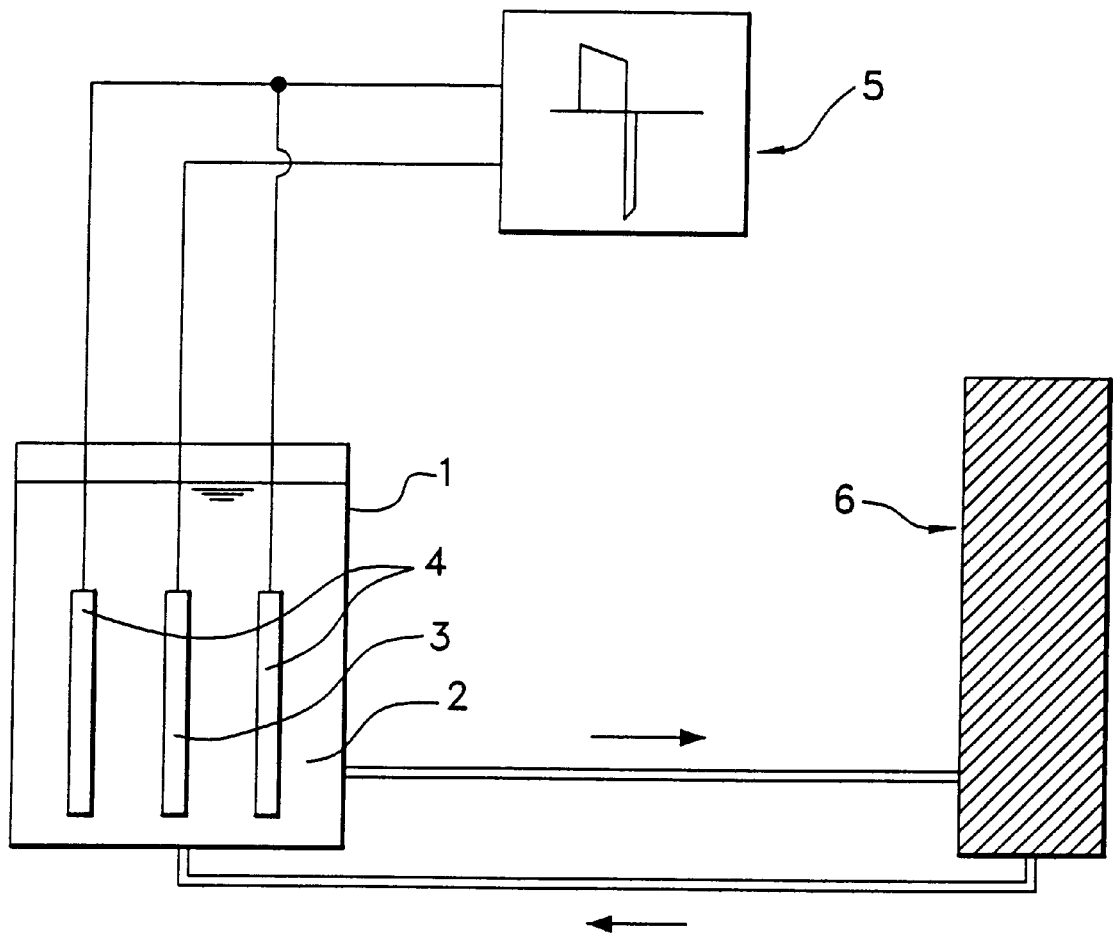
FIG. 4 is a diagrammatic illustration of a typical arrangement for treating workpieces by the immersion method, in accordance with this invention.

A typical arrangement, which is suitable for treating workpieces by the immersion method, is represented schematically in FIG. 4. In the container 1 the depositing solution 2, which contains compounds of the electrochemically reversible redox system, for example iron(II) and iron(III) ions, is situated. The depositing solution can be used for example for copper-plating and contains then the previously mentioned components.

The workpieces 3, for example circuit boards, and the anodes 4, for example titanium anodes coated with iridium oxide, are immersed into the depositing solution. The workpieces and the anodes are connected to the current source 5. Instead of regulating the current with the current source, there can also be a voltage arrangement, with which the voltage between the workpieces and the anodes is regulated. The depositing solution is directed continuously to a second container 6 by means of transporting equipment, which is not shown, for example pumps.

In this separate receptacle, namely the metal ion generator, which the depositing solution flows through, the metal in the depositing solution is replenished. In the metal ion generator, are situated, in the case of copper coating, metallic copper parts for example in the form of pieces, balls or pellets. The copper parts dissolve under the effects of the oxidised form of the redox compounds into copper ions. By dissolving the copper parts, the oxidised form of the redox system is converted into the reduced form. The solution which is enriched with the copper ions and the reduced form is directed back again to the first container by means of pumps which are not shown. The metallic copper used for regeneration does not need to contain phosphorus, but phosphorus also does not cause interference. In the traditional use of soluble copper anodes, the composition of the anode material is, on the other hand, greatly important. In this situation, the copper anodes must contain approx. 0.05% by wt phosphorus. Materials of this type are expensive and the phosphorus supplement causes residues in the electrolytic cell, which have to be removed by additional filtering.

In the circulation of the depositing solution, filters can also be added for separating mechanical and/or chemical residues. However in comparison to electrolytic cells with soluble anodes, there is less requirement, because the anode sediment, which arises from the addition of phoshorous, does not occur.

In the other preferred embodiment the circuit boards are transported through a conveyorized unit in a horizontal position and with a horizontal direction of movement. In the process depositing solution is injected continuously from below and/or from above onto the circuit boards by means of splash nozzles or flood pipes. The anodes are arranged at a spacing relative to the circuit boards and are brought, in the same way as the circuit boards, into contact with the depositing solution by means of a suitable device. The circuit boards make electrical contact on the side and move on a plane, which is arranged between the anode planes, right through the unit. If necessary, the depositing solution can be suctioned off again after penetrating through borings in the circuit boards by means of devices arranged on the side of the circuit board opposite the nozzles. The circuit boards make electrical contact via clamps. The transport speed in the unit is 0.01 to 2.5 cm/sec, preferably 0.2 to 1.7 cm/sec. The circuit boards are transported by means of rollers or plates.

Using the method according to the invention, circuit boards, particularly with copper coatings, can be coated electrolytically on the surfaces and on the surface areas of the borings, which have been already plated thinly with copper.

The following examples serve to explain the invention further:

EXAMPLE 1

COMPARATIVE EXAMPLE

In an electrolytic cell, which is provided with soluble copper anodes containing phosphorous, an aqueous copper bath was used with the following composition:

| | |
|---|---|
| copper sulphate (CuSO$_4$· 5 H$_2$O) | 80 g/liter |
| sulphuric acid, conc. | 180 g/liter, |
| iron-(II)-sulphate (FeSO$_4$· 7H$_2$O) | 35 g/liter, |
| sodium chloride | 0.08 g/liter | and the following brighttening additive compounds:

| | |
|---|---|
| polypropylene glycol | 1.5 g/liter, |
| 3-mercaptopropane-1-sulphonic acid, sodium salt | 0.006 g/liter, |
| N-acetyl thiourea | 0.001 g/liter. |

At an electrolytic temperature of 30° C., copper was deposited with a current density of 4 A/dm$^2$ on to a circuit board provided with a thin copper laminate on the surfaces and a thin copper layer in the borings, said circuit board, having a thickness of 1.6 mm and borings of 0.4 mm, was provided with scores in the copper laminate caused by scratching, for judging the degree of leveling of the deposited copper coating.

A highly bright copper coating was obtained. The metal dispersion (coating thickness in the borings×100/coating thickness in the circuit board surface), was however only 55%. The fracture elongation of a copper foil deposited from the solution was 21% (measured with the dishing test method with the Ductensiomat according to the DIN-ISO method 8401, described in R. Schulz, D. Nitsche, N. Kanani in Jahrbuch der Oberflächentechnik (Yearbook of surface technology), 1992, p46 ff.

EXAMPLE 2

COMPARATIVE EXAMPLE

With the electrolytic solution used in Example 1, a copper coating was deposited by means of a pulse current procedure. The pulse current cycle according to FIG. 1 contained the following current pulses:

Current, cathodic: current density 4 A/dm$^2$, duration 10 msec

Current, anodic: current density 8 A/dm$^2$; duration 0.5 msec

Relative to the result from Example 1, the metal dispersion improved from 55% to 75%. However, no usable copper coatings could be obtained, since their appearance was unacceptable. The copper coating was simply matt. In addition the fracture elongation of the copper foil, which was deposited under these conditions, deteriorated from 21% to 14%.

EXAMPLE 3

COMPARATIVE EXAMPLE

Example 1 was repeated with direct current. In the place of soluble copper anodes containing phosphorus, a titanium expanded metal, which was coated with mixed oxides, was used as a dimensionally stable, insoluble anode.

The deposited copper coatings were at first uniformly bright. The physical-mechanical properties were also satisfactory. However the metal dispersion values, which lay below the values given in Example 1, were measured. After a fairly long operation of the depositing bath, the appearance and the fracture elongation of the coatings deteriorated. At the same time, it was established that the mixed oxide coating of the titanium anode was eroded. This led to the over-voltage in the anode rising greatly.

EXAMPLE 4

Using the electrolytic solution given in Example 1, a circuit board, which was provided with copper laminate, was again copper-plated electrolytically. However, soluble copper anodes were not used, instead a dimensionally stable, insoluble anode was used. A titanium expanded metal which was coated with mixed oxides served as anode. In addition, a concentration of iron(II)sulphate(FESo$_4$.7H$_2$O) of 75 g/liter was used in the depositing solution. In order to regenerate the copper ions, the depositing solution was pumped from the treatment container into a separate container, which was filled with copper pieces. By oxidising the copper with iron(III) ions, which were acting as oxidisation medium and which were being formed continuosly on the anodes by oxidising the iron(II) ions, the copper pieces were successively dissolved and copper ions were formed. The depositing solution which was enriched with the copper ions proceeded from this container back into the treatment container.

By using the pulse current cycle given in Example 2, a uniformly highly bright copper coating could be obtained on the circuit board. The metal dispersion did not deteriorate relative to this example and accordingly had considerably better values than according to Example 1.

After copper had been deposited from the solution after a protracted period of time (electrical charge flow per solution volume: 10 Ahr/liter) the fracture elongation, calculated according to the dishing test method, from this aged solution, and of a copper foil, which was deposited under the previously mentioned conditions, came to 20% and thus lay in the range of values conveyed in Example 1. The insoluble anodes show no signs of impairment.

The copper coating deposited on the circuit board surfaces and in the borings withstood a thermal shock test, without fractures appearing in the copper coating, in particular, not in the transitions from the circuit board surface to the borings either. For this purpose, the circuit board was submerged twice in a 288° C. hot soldering bath and cooled between times at room temperature.

EXAMPLE 5

COMPARATIVE EXAMPLE

In a conveyorized unit serving to treat circuit boards horizontally, copper laminated circuit boards which were provided with a thin copper coating in the borings, were copper-plated in an electrolytic solution by means of direct current. Copper anodes containing phosphorous were used as anodes. The electrolytic solution had the following composition:

| | |
|---|---|
| copper sulphate (CuSO$_4$ · 5H$_2$O) | 80 g/liter, |
| sulphuric acid, conc. | 200 g/liter, |
| iron-(III)-sulphate (Fe$_2$(SO$_4$)$_3$ · 9H$_2$O) | 35 g/liter, |
| sodium chloride | 0.06 g/liter |
| with the following brightness-producing additive compounds: | |
| polyethylene glycol | 1.0 g/liter, |
| 3-(benzthiazolyl-2-thio)-propyl- sulphonic acid, sodium salt | 0.01 g/liter, |
| acetamide | 0.05 g/liter. |

At an electrolytic temperature of 34° C. and with a current density of 6 A/dm$^2$, a bright copper coating was obtained on the laminate which was provided in advance with scores caused by scratching. The circuit board was subjected five times to a thermal shock test in a soldering bath. No fractures appeared in the copper coating. The metal dispersion in borings with a diameter of 0.6 mm was 62%.

EXAMPLE 6

COMPARATIVE EXAMPLE

The experiment of Example 5 was repeated. In the first place, a pulse current method according to FIG. 1 was used instead of direct current within the following parameters.

Current, cathodic: current density 6 A/dm$^2$, duration 10 msec

Current, anodic: current density 10 A/dm$^2$, duration 0.5 msec

Relative to Example 4, a considerably improved metal dispersion was achieved. It came to 85% in the 0.6 mm large borings. Certainly the appearance of the deposited copper coating had deteriorated noticeably. The copper coating was not uniform and matt spots had appeared. During the thermal shock test, using the presently described conditions, fractures appeared on the copper coating after being submerged five times in a soldering bath.

EXAMPLE 7

Under the conditions given in Example 4, circuit boards were coated with copper by using a titanium expanded metal anode, which was coated with platinum, instead of soluble copper anodes. In place of direct current, a pulse current method, within the parameters given in Example 6 was applied. In addition, the content of iron(II)sulphate (FeSO$_4$.7H$_2$O) in the depositing solution was raised to 80 g/liter.

The deposited copper coating was uniformly highly bright and therefore had a considerably better appearance than the circuit board produced according to the method of Example 5. The circuit board was once again subjected five times to a thermal shock test in a 288° C. hot soldering bath by submerging and cooling between times at room temperature. No fractures could be observed in the copper coating. In addition, the metal dispersion values improved relative to Example 6. Values above 85% were measured. The insoluble anodes were also stable for a fairly long time.

What is claimed is:

1. Method for the electrolytic deposition of fine crystalline metal coatings with uniform distribution of layer thicknesses and uniform brightness, high fracture elongation and tensile strength even in places of high current density, by means of a pulse current method comprising a duration of cathodic, or cathodic and anodic, pulses of current or voltage, comprising the steps of:
    a) applying the pulse current on workpieces polarized as cathodes and
    b) using inert, dimensionally-stable insoluble anodes coated with noble metals or oxides of noble metals
    c) from a deposition solution containing
        c1) ions of the metal to be deposited,
        c2) additive compounds for controlling the brightness, the fracture elongation and the tensile strength, and
        c3) compounds of at least one electrochemically reversible redox system, by means of the oxidised form of which the ions of the metal to be deposited are formed by at least partial dissolution of pieces of said metal.

2. Method according to claim 1, where the pulse current method comprises an adjustable current pulse sequence comprising anodic current pulses and cathodic current pulses on the workpiece, where said adjustable current pulse sequence is periodically repeated.

3. Method according to claim 2, characterised in that the current of the anodic current pulses is set at twice or thrice the height of the current of the cathodic current pulses.

4. Method according to claim 2, characterised in that the duration of an anodic current pulse on the workpieces is set from 0.3 milliseconds to 10 milliseconds.

5. The method of claim 2, including intermediate rest phases with zero current density between anodic current pulses and cathodic current pulses.

6. Method according to claim 1 characterised in that, between two cathodic current pulses at the workpieces alternately either one anodic current pulse or a rest phase with the current density zero is set, or a combination of an anodic current pulse and a rest phase.

7. Method according to one of claims 1–2, characterised in that titanium expanded metal layered with iridiumoxide and irradiated by means of fine particles is used as an anode.

8. Method according to one of claims 1–2, characterised in that iron-(II)- and iron-(III)-compounds are used as an electrochemically reversible redox system.

9. Method according to claim 8, characterised in that an iron ion concentration of at least 10 g/liter is set in the deposition solution.

10. Method according to one of claims 1–2, for electrolytic deposition of copper coatings on surfaces and peripheral surfaces of bores of circuit boards.

* * * * *